US 6,909,159 B2

(12) United States Patent
Friend et al.

(10) Patent No.: US 6,909,159 B2
(45) Date of Patent: Jun. 21, 2005

(54) METHOD AND APPARATUS TO MAKE A SEMICONDUCTOR CHIP SUSCEPTIBLE TO RADIATION FAILURE

(75) Inventors: David Michael Friend, Rochester, MN (US); Nghia Van Phan, Rochester, MN (US); Michael James Rohn, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 289 days.

(21) Appl. No.: 10/176,233

(22) Filed: Jun. 20, 2002

(65) Prior Publication Data

US 2003/0234430 A1 Dec. 25, 2003

(51) Int. Cl.⁷ .................................. G11C 5/00
(52) U.S. Cl. ................... 257/428; 257/427; 257/431; 257/314
(58) Field of Search .................. 257/428, 427, 257/429, 430, 431, 426, 432

(56) References Cited

U.S. PATENT DOCUMENTS 5,067,106 A * 11/1991 Pedersen et al. .............. 714/2
5,736,930 A * 4/1998 Cappels ..................... 340/642

* cited by examiner

Primary Examiner—Nathan J. Flynn
Assistant Examiner—Fazli Erdem
(74) Attorney, Agent, or Firm—Robert R. Williams

(57) ABSTRACT

Methods and apparatus are provided for reducing the overall radiation hardness of a semiconductor chip. A radiation detector and a failure memory are provided. A disable signal or signals is produced by the failure memory. The disable signal is a required input to a user logic function, such as an off chip driver, an off chip receiver, a clock, or a static random access memory. When the radiation detector detects radiation, that detection is stored in the failure memory. The disable signal, when active, causes some or all of the user function to be inoperative. This invention is particularly important when the semiconductor chip is produced in a silicon on insulator (SOI) Complementary Metal Oxide Semiconductor (CMOS) process, which is naturally radiation resistant.

17 Claims, 10 Drawing Sheets

METHOD AND APPARATUS TO MAKE A SEMICONDUCTOR CHIP SUSCEPTIBLE TO RADIATION FAILURE

FIELD OF THE INVENTION

The present invention relates to semiconductor chips. In particular, the present invention relates reducing radiation hardness on chips

DESCRIPTION OF THE RELATED ART

Very Large Scale Integration (VLSI) employing bulk substrate Complementary Metal Oxide Semiconductor (CMOS) technology has been one of the major success stories in recent years. Virtually all of the recent high performance microprocessors, as well as the Application Specific Integrated Circuit (ASIC) chips have been implemented in CMOS on a bulk substrate.

Bulk substrate technology provides a relatively inexpensive foundation upon which to create the N-channel Field Effect Transistors (NFETs) and the P-channel Field Effect Transistors (PFETs) needed to make modern logic circuits, such as NANDs, NORs, and memory elements, such as latches, registers, and Static Random Access Memories (SRAMs). CMOS implemented on a bulk substrate technology is called bulk CMOS. Source and drain areas on the NFETs are directly created in the bulk substrate, in the case where the bulk substrate is a P– semiconductor material. In some implementations, the bulk substrate is a P+ semiconductor material with a thin P– epitaxial layer grown on the top. A P+ substrate with a P– epitaxial layer is more costly to produce but has some advantages, such as higher resistance to latchup phenomena. PFET devices are created in N-wells that are implanted or diffused into the bulk P– or the epitaxial P– layer created on a P+ substrate as described above.

Microprocessors built on bulk CMOS technology have seen dramatic increases in frequency with technology advances. Microprocessor clock frequencies have risen from approximately 10 megahertz (MHz) in 1985, to approximately 100 MHz in 1991 to over a gigahertz (GHz) in 2001.

Several limitations of bulk CMOS are beginning to limit continued increases in frequencies.

A first limitation of bulk CMOS is the relatively large amount of capacitance in the reverse-biased junctions associated with NFET and PFET drains. These capacitances must be charged and discharged during switching of the logic circuits on the microprocessor chip or the ASIC chip. Delays are longer when more capacitance must be charged and discharged. Thus the capacitance of the drains of the NFETs and PFETs limit the performance of the microprocessor or the ASIC. CMOS NAND logic circuits are designed with stacked NFETs. CMOS NOR logic circuits are designed with stacked PFETs. In these circuits, the sources of most of the Field Effect Transistors (FETs) in the stacks of NFETs and PFETs also often are switched from one voltage level to another, further adding to capacitance that must be switched, and thus degrading performance.

Undesired capacitance not only degrades performance, but also causes more power to be dissipated. Power dissipated in CMOS circuits is usually approximated by equation (1):

$$P = \tfrac{1}{2} * C * V^2 * f \tag{1}$$

where P=power in watts; C=capacitance in farads switched per cycle; V=voltage in volts; f=frequency in hertz. Some circuits, such as clocks, switch twice per cycle.

Power is becoming a serious problem. Batteries power many electronic products. Lower power translates into longer battery life, or, alternatively, the ability to use a smaller, cheaper, battery. A lower power microprocessor or ASIC product therefore has a competitive edge in the battery-powered marketplace. Even when large computers or other electronic products are plugged into the wall, heat buildup calls for elaborate and expensive cooling mechanisms. Lower power microprocessors and ASIC products therefore also hold a competitive advantage in such products as well.

FIG. 1A shows a cross sectional view of an NFET comprising a gate 2, a drain 4 and a source 5 created in a bulk CMOS process, using a P– substrate 7. Note in particular that the bottoms of source 5 and drain 4 of the NFET form junctions with P– substrate 7. The capacitance associated with these junction areas must be charged and discharged as discussed above.

A second limitation of bulk CMOS is that the bodies of all NFETs are coupled to ground (or another suitable lower voltage). In the view of the NFET in FIG. 1A, the area between source 5 and drain 4 is the body, and is therefore coupled electrically to substrate 7, which is usually coupled to ground, as stated. PFETs (not shown) are constructed in an N-well, which is usually connected to Vdd, a supply voltage that is positive with respect to ground, and thus, the bodies of all PFETs are similarly coupled to Vdd. The threshold voltage of an FET is strongly dependent on the voltage between the source of the FET and the body of the FET. Consider a CMOS NAND with two inputs. Two NFETs are stacked, with a gate of each NFET coupled to one of the two inputs. The bottom NFET has a source coupled to ground. The drain of the bottom NFET is coupled to the source of the top NFET. The drain of the top NFET is coupled to the output of the two input CMOS NAND. Assume that the top NFET has a logical "1" (i.e., Vdd) coupled to its gate, but the bottom NFET has a logical "0" (i.e., ground) coupled to its gate. The two NFETs provide the pull-down portion of the CMOS NAND circuit. A complementary pull-up portion of the CMOS NAND circuit comprises two PFETs. Each PFET has a gate coupled to one of the two inputs, a source coupled to Vdd, and a drain coupled to the output of the two input CMOS NAND. In the example above, the PFET that has a gate coupled to the same input as the gate on the lower NFET is conducting, and the output of the CMOS NAND is at Vdd. Since the top NFET is conducting but the bottom NFET is nonconducting, the source of the top NFET is also at Vdd. The source to body voltage of the top NFET is therefore Vdd, and the threshold voltage of the top NFET is relatively high. When the input coupled to the bottom NFET switches, the initially high threshold voltage of the top NFET reduces conductance of the two-NFET stack. As stated before, the charge stored on the reverse-biased junctions associated with the drains of the top and the bottom NFET, the source of the top NFET, and the drains of both PFETs must be discharged when the output of the two-input NAND is switched in the example.

Reduction in the threshold voltage of the top NFET, and reduction of capacitance both serve to improve performance.

To reduce the limitations of bulk CMOS, use of silicon on insulator (SOI) is becoming a common way to improve performance of microprocessors, ASICs, SRAMs, and other semiconductor chips.

The major difference between CMOS on SOI and bulk CMOS is that SOI CMOS places an insulator directly below the FET devices, dramatically reducing the junction areas, and therefore the associated capacitances. The insulator also isolates the bodies of the FETs from the substrate in the case of NFETs, or the N-well, in the case of PFETs.

FIG. 1B shows a cross section of an NFET implemented in SOI, comprising a gate 2, a drain 4, and a source 5. FIG. 1B shows that the bottoms of the source and drain regions are in contact with a buried oxide 8, which dramatically reduces the capacitance associated with source 5 and drain 4. In the case of the bulk CMOS devices, junction capacitance can be relatively large. In the case of the SOI CMOS devices, the capacitance of the bottom of the source and drain regions is much less, and can be calculated using the textbook capacitance equation (2):

$$C = epsilon * area / distance\ between\ plates \qquad (2)$$

where a top plate of the capacitor is the bottom of a source or drain region; a bottom plate of the capacitor is the P-substrate in the example; epsilon is the dielectric constant of the medium (the buried oxide) between capacitor plates; area is the area in which the capacitor plates overlap (i.e., the bottom of the source or drain, since the buried oxide in the example underlies the entire area); the distance between plates is the thickness of the buried oxide. The geometries involved in SOI CMOS are such that this capacitance is extremely small relative to the junction capacitance associated with sources and drains in bulk CMOS.

As stated above, SOI CMOS FETs also have their bodies isolated from the ground and Vdd supplies, for NFETs and PFETs, respectively. The bodies of NFETs in SOI CMOS tend to float higher than ground; the bodies of PFETs in SOI CMOS tend to float lower than Vdd. This is particularly true for stacked devices. The resulting lower threshold voltages cause the FETs to conduct more current for a given FET size, therefore yielding logic circuits with less delay.

A textbook providing much more detail on the advantages of SOI CMOS over bulk CMOS is "SOI Circuit Design Concepts", by Kerry Bernstein and Norman J. Rohrer, Published by Kluwer Academic Publishers, ISBN 0-7923-7762-1, (hereinafter Bernstein). Bernstein also describes several methods of providing the insulating layer required in an SOI semiconductor process.

Bernstein suggests a rule of thumb that reduction in junction capacitance is responsible for approximately half the advantage of SOI CMOS; reduction of average FET threshold is responsible for the other half.

The advantages of SOI CMOS have been exploited in some applications to provide a faster microprocessor, ASIC, or other semiconductor product at the same power. Other applications choose to operate the microprocessor, ASIC, or other semiconductor product at the same frequency that a bulk CMOS implementation would run, but at significantly lower power.

Creation of semiconductor chips involves relatively high fixed costs. The products have to be designed, requiring expensive design tools and engineering labor. In addition, the fabrication of the products requires extremely expensive semiconductor tools and factories. Those making such products therefore need to have the largest possible world market, so that the fixed costs can be spread out over as much volume of product as possible.

A characteristic of SOI CMOS is that it is much less susceptible to failures induced by radiation than is bulk CMOS. These failures are often called soft errors. Citing from Bernstein, page 141, Soft errors refer to false data states induced in the microprocessor logic or memory by the instantaneous introduction of high amounts of unexpected charge, created by a radiation event. Charge can be created as a result of incident alpha particles or high energy protons or neutrons (cosmic rays)" . . . "Radiation effects cause less charge generation and collection in SOI, as the sensitive region through which the alpha particle passes is now limited to the active silicon layer above the SIMOX (or BOX)."

SIMOX (Separation by the Implantation of Oxygen) is one process for creating the insulating layer beneath the FET devices. BOX stands for "Buried Oxide".

SOI CMOS is far less susceptible to radiation than is bulk CMOS. Furthermore, as the supply voltage, Vdd, decreases, the SOI CMOS advantage becomes far more pronounced. This is significant, because as technology improves, and semiconductor device sizes shrink, supply voltages are decreasing to prevent breakdown and/or wearout acceleration on the product. Supply voltages have dropped from 5 volts in 1985, to 3.3 volts in the early 1990s, to 2.5 volts in the mid 1990s. 1.8 volt was common in the late 1990s. Current CMOS products are being designed to operate at a supply voltage of a volt or less. Bernstein shows on page 143 that for identical memory array hardware built in SOI and bulk CMOS, the bulk CMOS version has over an order of magnitude higher rate of soft errors than the SOI version. As supply voltage decreases further, that margin will increase.

Although reducing the likelihood of soft errors is, in general, an advantage, a product with a high resistance to radiation can and does limit the size of the marketplace to which the product can be sold. Exports of items on the U.S. Munitions List (22 C.F.R. 121, et seq.), under State Department cognizance, generally require a license or other authority. The United States government restricts foreign sale or export of such products to some countries.

Code of Federal Regulations, Title 22, Chapter 1, part 121, "The United States Munitions List", under "Category XV—Spacecraft Systems and Associated Equipment" includes as restricted items:

d. Radiation-hardened microelectronic circuits that meet or exceed all five of the following characteristics:
1. A total dose of $5 \times 10^5$ Rads (SI);
2. A dose rate upset of $5 \times 10^8$ Rads (SI)/Sec;
3. A neutron dose of $1 \times 10^{14}$ N/cm$^2$;
4. A single event upset of $1 \times 10^{-7}$ or less error/bit/day;
5. Single event latch-up free and having a dose rate latch-up of $5 \times 10^8$ Rads (SI)/sec or greater SOI CMOS microprocessors, Static Random Access Memories (SRAMs), Dynamic Random Access Memories (DRAMs), and ASIC products are resistant enough to radiation to fall into the radiation-hardened microelectronic circuit category, and are therefore subject to export restrictions and market limitations.

There exist other semiconductor processes that also provide relatively high resistance to radiation. Semiconductor products produced on such processes also have their markets limited by the United States Government munitions restrictions. Although SOI CMOS is the primary focus of this invention, the spirit and scope of the invention includes any semiconductor process that results in a radiation resistant product.

Therefore, a need exists for a method and apparatus that allow semiconductor products that are produced in processes that are radiation resistant, such as SOI CMOS products, to be marketed free from export and trade restrictions.

SUMMARY OF THE INVENTION

The present invention is a method and apparatus that preserves the power and performance competitive advantages of SOI CMOS or similar radiation-hard semiconductor products, but which is less radiation-hard and therefore can be more easily and more broadly marketed.

In an embodiment, a radiation detector on a semiconductor chip detects presence of radiation and stores information about the detection in a failure memory. An output of the failure memory is used to disable portions of the user's desired function on the chip.

In another embodiment, the failure memory is volatile memory so that the chip is not permanently disabled upon encountering a detection of radiation. In an alternative embodiment, the failure memory is nonvolatile memory, so that the chip is permanently disabled upon encountering a detection of radiation.

In another embodiment of an SOI CMOS product built using the Separation by the Implantation of Oxygen (SIMOX) process, the radiation detector comprises an area constructed without the Buried Oxide (BOX). A radiation detector logic function that is especially vulnerable to radiation, such as an SRAM, latches, or dynamic logic is placed on the area. This logic function has radiation hardness of a bulk CMOS product, since no BOX exists in that area.

In an embodiment of the invention, the radiation detector stores information about detection of radiation in a failure memory. If radiation is detected, one or more disable signals is sent from the failure memory to one or more functions of the SOI CMOS portion of the chip, which are disabled respondent to the disable signal or signals; thereby causing the chip to be nonfunctional for its intended purpose.

In another embodiment of the invention, the disable signal(s) disables a clock function on the semiconductor chip. In another embodiment of the invention, the disable signal(s) disables off-chip drivers and/or receivers of the chip. In another embodiment of the invention, one or more SRAMs are disabled by the disable signal(s). Use of the disable signal to disable any function in the radiation-hard area of the SOI CMOS or other radiation-hard type of chip is within the spirit and scope of the present invention.

In an embodiment, semiconductor products produced in a method that results in radiation resistant products, are made susceptible to radiation failures.

DETAILED DESCRIPTION OF THE PREFERRED EMBODIMENTS

Having reference now to the figures, the present invention will be described in detail.

Figure 1A:
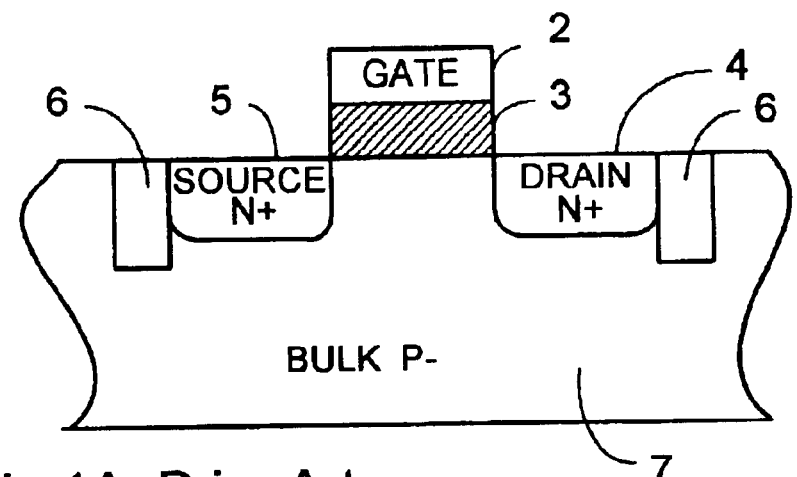
FIG. 1A shows a cross section of a bulk CMOS chip, showing an NFET.

FIG. 1A shows a cross section of a conventional N-channel Field Effect Transistor (NFET), comprising a gate 2, a gate oxide 3, a drain 4, a source 5, and shallow trench isolation 6, constructed in a bulk P– silicon substrate. Such a structure is sensitive to radiation. A high-energy particle (not shown) will ionize a region in the bulk P– substrate 7. Positive charges will be drawn off to a low voltage supply (usually ground) to which the substrate is coupled. Negative charges will be attracted to a positively charged drain 4. In precharged circuits, such as Dynamic Random Access Memory (DRAM) precharged logic, or in high-impedance circuits such Static Random Access Memory (SRAM), the accumulation of the negative charges on a positively-charged N+ drain, can cause faulty operation. Similarly, accumulation of positive charges on a negatively precharged P+ drain can cause faulty operation. Such faults are called soft errors, and the rate of occurrence of the faults is called the soft error rate.

Figure 1B:
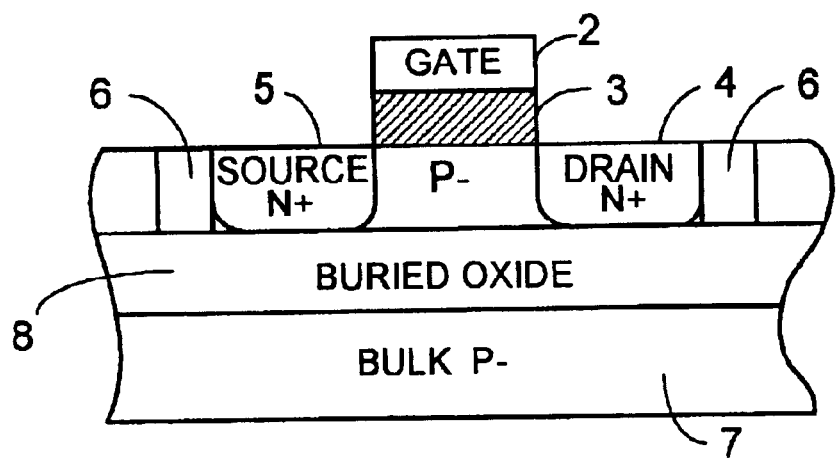
FIG. 1B shows a cross section of an SOI chip, showing an NFET.

FIG. 1B shows a conventional Silicon On Insulator (SOI) NFET in cross-section. The structure is similar to the conventional NFET shown in FIG. 1, with the addition of an insulating layer, the buried oxide (BOX) that is physically between the bottoms of the source and drain areas of NFET devices and the bulk P– substrate in the example. Advantages of SOI were described earlier. SOI CMOS circuits are far less susceptible to radiation than are bulk CMOS circuits. A high-energy particle (not shown) cannot ionize nearly as much semiconductor volume, because of the insulating layer. Furthermore, negative charges (except in the small volume of the FET body itself) cannot reach the drain regions.

Figure 2:
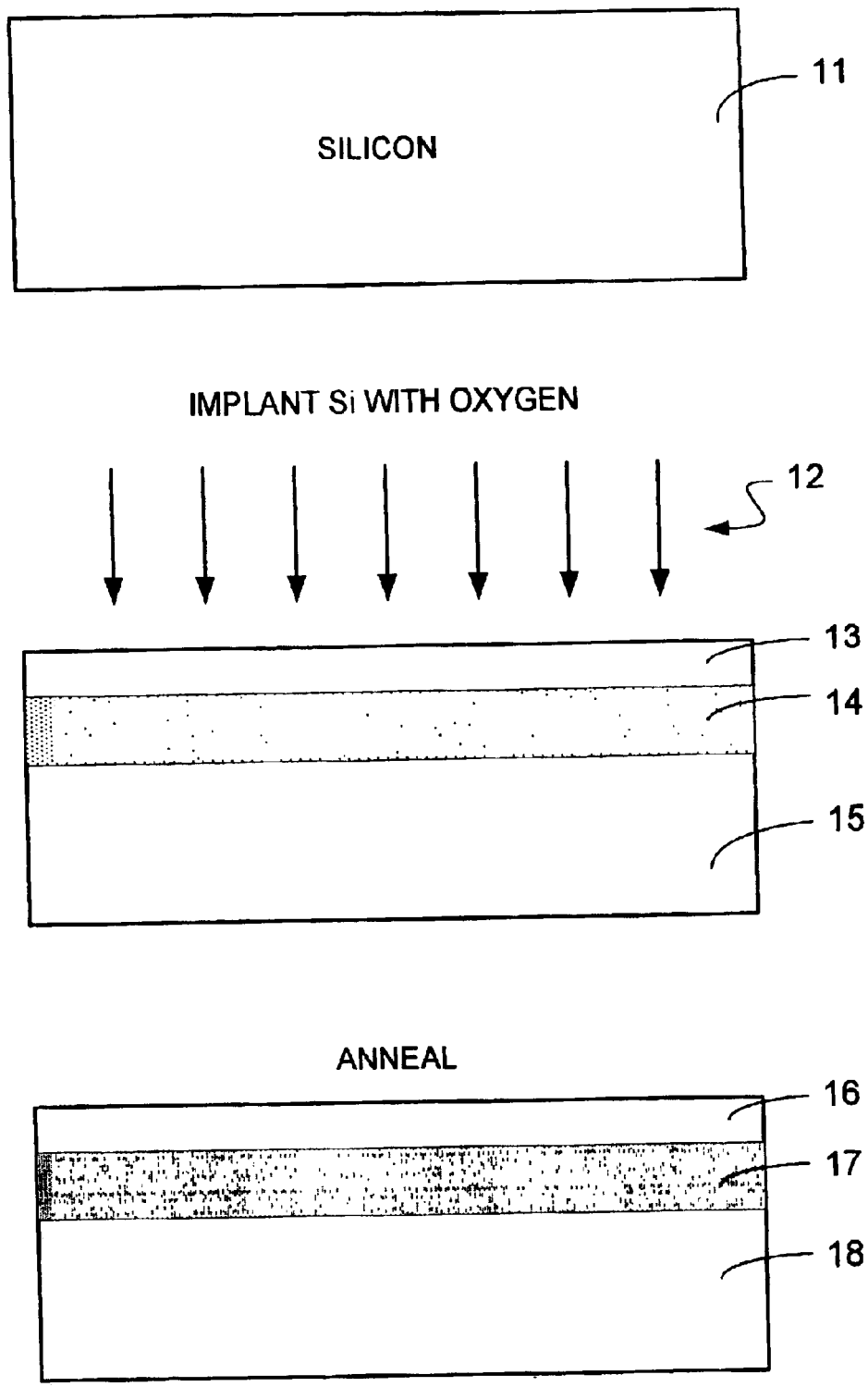
FIG. 2 shows a high level sequence of process steps to create a buried oxide layer on a semiconductor chip.

FIG. 2 shows a set of semiconductor processing steps used by the SIMOX (Separation by the Implantation of Oxygen) process to create the buried oxide layer. A bulk silicon wafer substrate 11, usually doped P–, is the starting point. High-energy oxygen implant 12 is implanted into wafer, causing oxygen atoms to penetrate some distance into substrate 11. At the completion of oxygen implant 12, a damaged thin layer 13 of P– is at the top of the substrate. Oxygen atoms are in layer 14. P– substrate 15 is essentially unchanged, since few or none of the oxygen atoms penetrate deeply enough to reach that area. Finally an anneal step repairs the damage done to thin layer 13, creating high-quality P– layer 16. The anneal step also causes the oxygen atoms to form a silicon dioxide layer 17, which is the insulating, buried oxide layer, discussed above.

Figure 3:
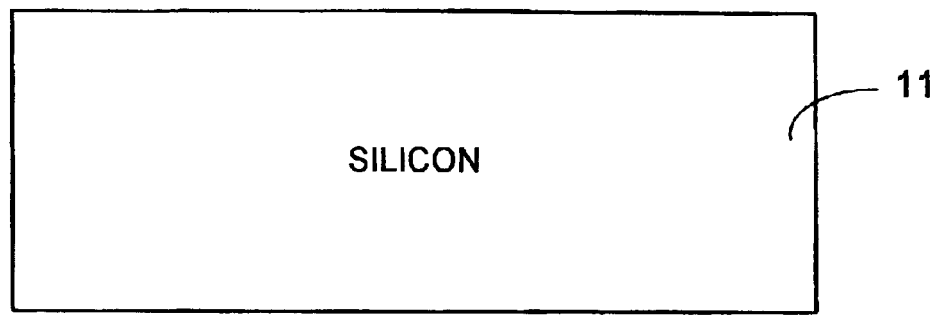
FIG. 3 shows a high level sequence of process steps, including a mask, to create a buried oxide layer on a semiconductor chip, while leaving an area of the semiconductor without a buried oxide layer.
Figure 3:
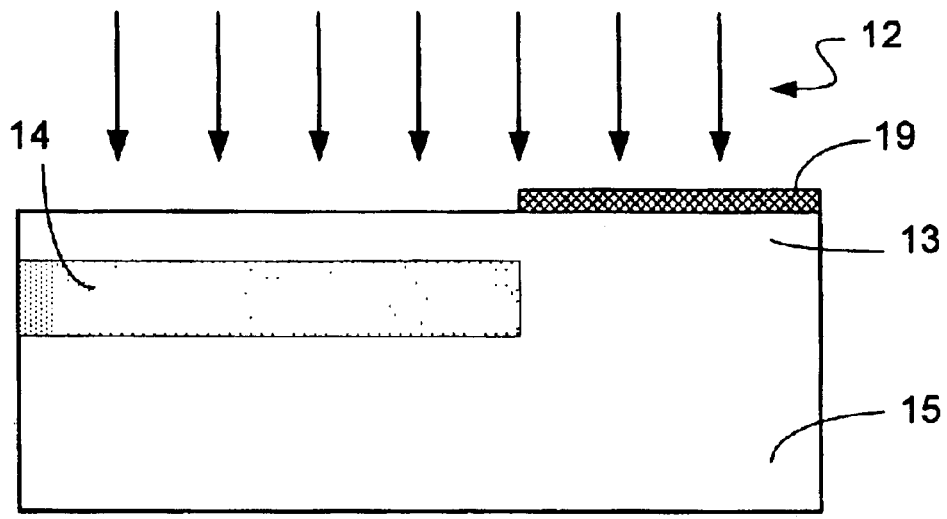
Figure 3:
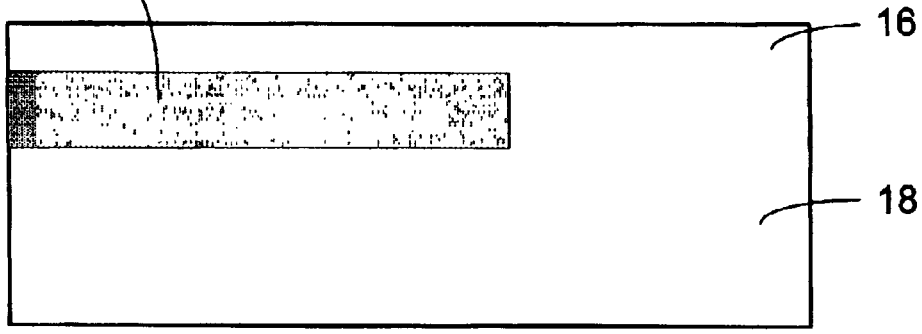

FIG. 3 shows a process similar to the process of FIG. 2, with the addition of mask 19, which blocks oxygen implant 12 from reaching selected areas of substrate 11. CMOS devices created in such selected regions are conventional bulk CMOS because no buried oxide layer 17 exists in the selected regions.

Figure 4:
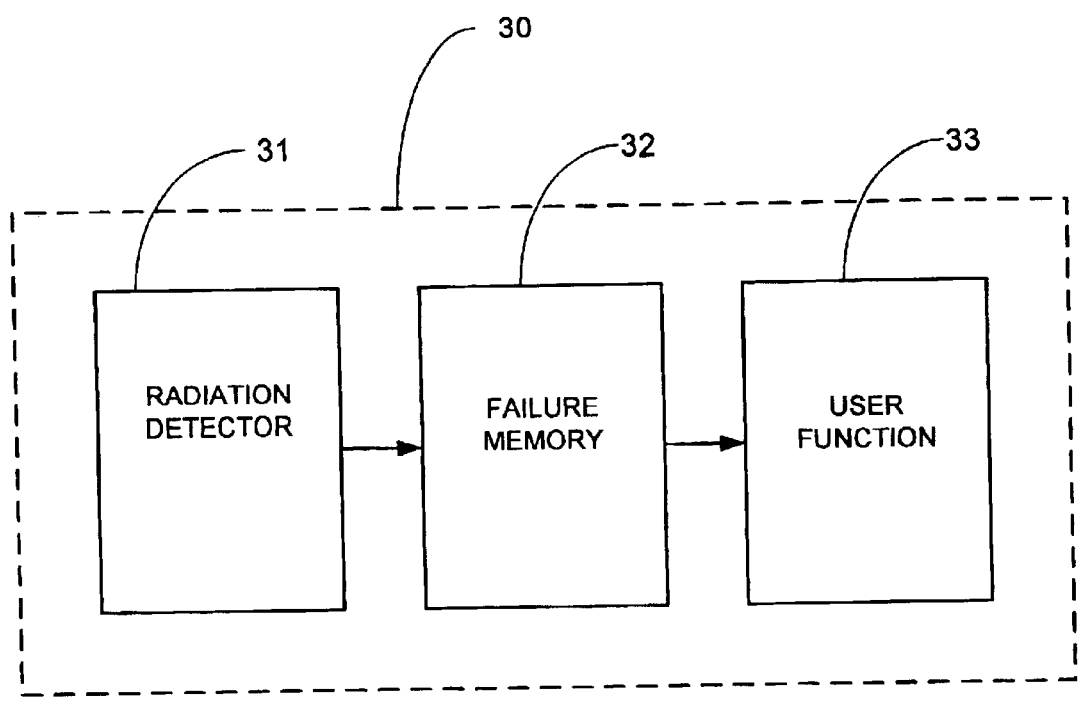
FIG. 4 shows a high-level block diagram of the invention, comprising a radiation detector, and a failure memory.

FIG. 4 is a high-level block diagram of a semiconductor chip 30 comprising a radiation detector 31, a failure memory 32, and a user function 33. Radiation detector 31 on the chip is sensitive to radiation and activates one or more signals responsive to the detection of radiation. Failure memory 32 can be a volatile memory or a nonvolatile memory. A volatile memory will retain information about the detection of radiation as long as the chip is powered on. The volatile memory is implemented as a conventional static or dynamic latch, or in an SRAM or DRAM on the chip. Preferably, the volatile memory is built in a radiation-hard region of the chip so that further exposure to radiation does not erase the information. A nonvolatile memory is built using a fuse, a ferroelectric memory, a flash memory, or other similar memory device that retains information even when the chip is not powered on. Embodiments using ferroelectric memory or flash memory, or other memory that can be written to are preferably designed such that the state of the memory can not be reset by a customer, following shipment of the chip to the customer.

User function 33 is the logical function desired by the user, or customer. User function 33 can comprise microprocessor function, SRAM, DRAM, latches, Programmable Logic Arrays, clock functions, Input/Output (I/O) circuitry, or any other logic function the customer desires on the chip. Some or all of user function 33 is disabled by a signal from failure memory 32 when radiation detector 31 detects radiation and stores information about the detection in failure memory 32.

Figure 5:
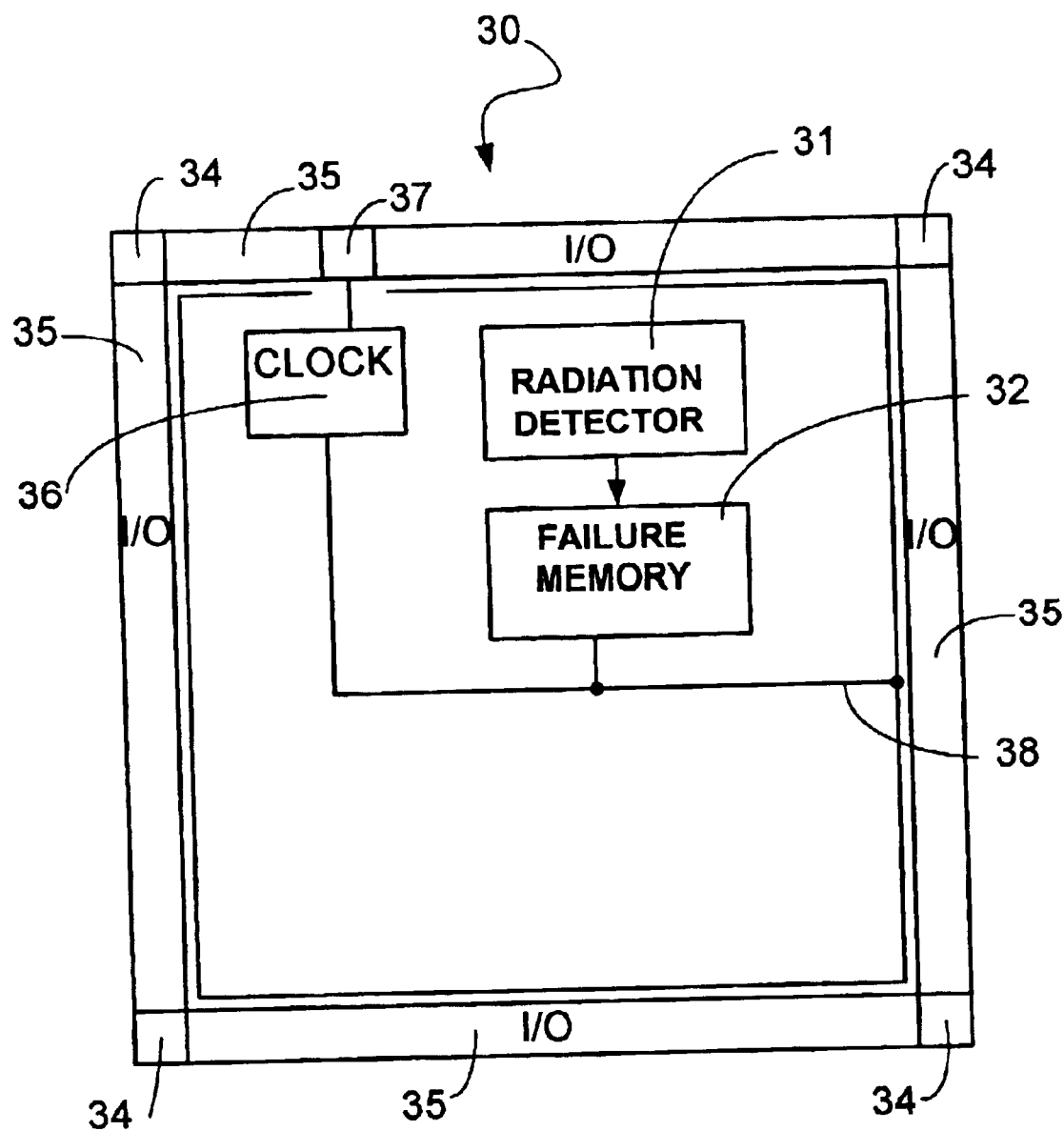
FIG. 5 shows a semiconductor chip with a radiation detector and a failure memory. The failure memory is coupled to a clock on the chip and to input and output (I/O) circuits on the chip.

FIG. 5 shows chip 30 in more detail from a chip schematic view. Radiation detector 31 and failure memory 32 are shown as taking up space on chip 30. User function 33 from FIG. 4 takes up some or all of the remainder of the physical area of chip 30. For example, FIG. 5 shows I/O areas 35 on the edges of chip 30. Input and output circuits (I/O), such as off chip drivers (OCDs) and off chip receivers (OCRs) are placed in areas 35. In many modern chips, I/O circuitry is not confined to special areas 35, but is intermingled with other circuitry on the chip, however I/O circuits are specialized in many respects, in general, having slew rate control, higher current drive capability, electrostatic discharge protection, and special disabling functions for test purposes. Areas 35 are shown separate only for exemplary purposes. Clock 36 represents one or more clock circuits that are common on chips, and these circuits control when latches can drive and receive data on the chip. Clock 36 is shown coupled to clock receiver 37. Special clock receiver 37 comprises circuitry used to receive an external clock. Clock receiver 37 can be a differential receiver or a single-ended receiver. Clock 36 can simply repower signals received by clock receiver 37. Clock 36 can be circuitry that uses signals received by clock 37 as a reference, such as when clock 36 comprises one or more phase locked loops. Any clock 36 is to be considered within the spirit and scope of this invention. In chip designs featuring I/O regions 35 at the periphery of the chip, often regions 34 are unused or are used for special purpose circuitry such as test circuitry. DISABLE 38 is a signal or signals produced by failure memory 32 that is coupled to one or more circuits in user function 33 and prevents such user function 33 from operating when DISABLE 38 is active. In FIG. 5, clock 36 and I/O function 35 are exemplary user functions 33.

Figure 6:
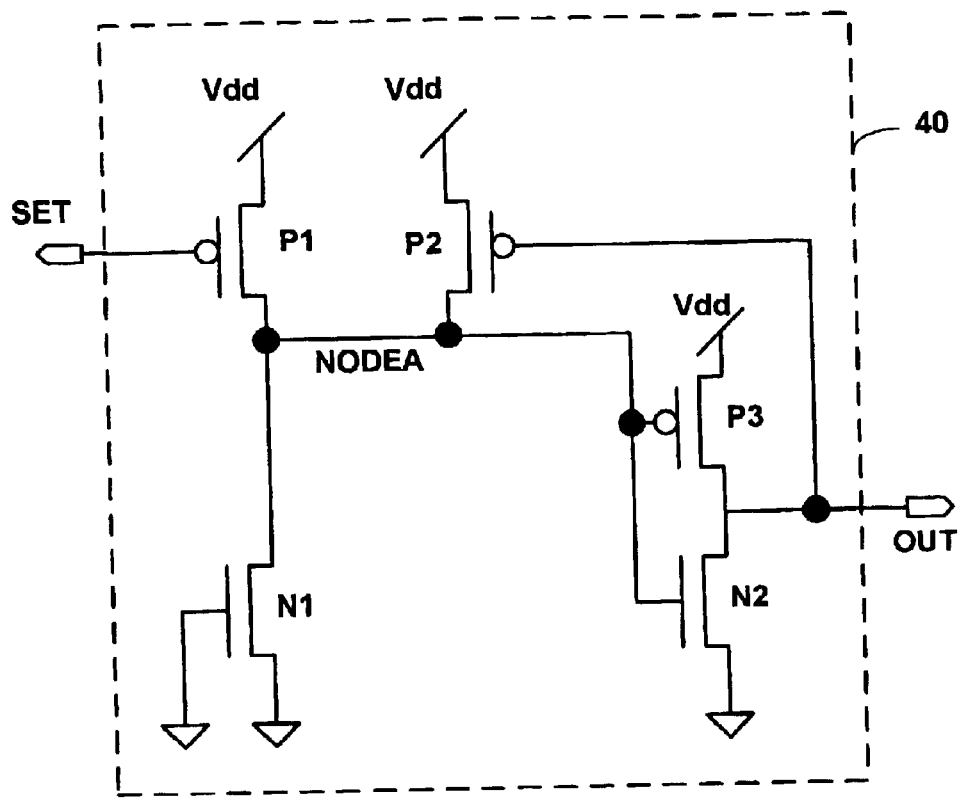
FIG. 6 shows a dynamic circuit suitable to detect radiation via soft error rate.

FIG. 6 shows a exemplary circuit that provides a combined, or merged, radiation detector 31 and failure memory 32. In this circuit, failure memory 32 is volatile. Cell 40 comprises the merged radiation detector 31 and failure memory 32. The circuit is a dynamic, precharged noninverting buffer, with an input coupled to ground. When input SET is low, PFET P1 conducts, charging NODEA high (to Vdd). PFET P3 and NFET N2 comprise a static inverter. When NODEA is high, node OUT is low. PFET P2 is then active, holding NODEA high even when input SET returns to high. P2 is a very weak PFET, advantageously designed with a very long and very narrow channel. NFET N1 has a drain coupled to NODEA and a gate and a source coupled to ground. N1 is needed to provide an NFET drain that will collect negative charges when radiation particles pass through the chip near the NFET drain. In an embodiment, only the N+ drain region is implemented, with no FET gate or source.

When a high-energy radiation particle passes near the drain of N1, NODEA is discharged. The inverter comprising P3 and N2 causes node OUT to rise to a high level (Vdd), and P2 is turned off, as the gate of P2 is coupled to node OUT. A high (logic "1") level on node OUT signals that radiation has been detected. The circuit shown in FIG. 6 comprises a half-latch. NODEA, if pulled down, may float high enough, in time, to cause the static inverter comprising P3 and N2 to again cause node OUT to be pulled low. To prevent this possibility, the gate of N1 can be coupled to node OUT, making the circuit a full latch. P1 would then have to be designed strong enough relative to N1 to guarantee that P1 can set the full latch.

Discharge of NODEA by radiation is probabilistic, that is, NODEA has some probability of being affected by a particular particle of radiation. Many particles of radiation pass through the chip without passing through or near the drain of N1. Some particles may not have enough energy to discharge NODEA enough to cause node OUT to rise.

Figure 7:
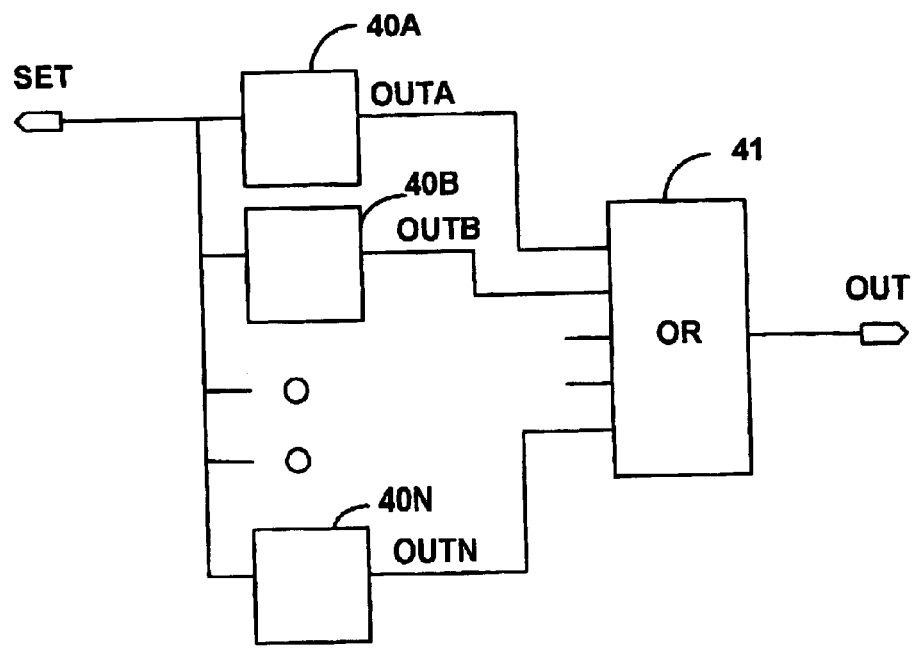
FIG. 7 shows a number of the dynamic circuit shown in FIG. 6 implemented and logically OR'ed to increase probability of radiation detection.

To raise the likelihood of radiation detection, circuit 40 is replicated many times, as shown in FIG. 7. Circuit 40 is replicated as instances 40A through 40N, where N can indicate, for example, a thousand instances of circuit 40. A technologist must determine the soft error rate probabilities for his or her technology and design the radiation detector with enough instances of circuit 40 so as to raise the soft error failure rate sufficiently high to avoid the product being categorized as a munition, per the earlier discussion. A logical combination of the outputs of circuit 40 instances 40A–40N is shown performed by OR circuit 41, which then produces a node OUT which is driven high when any of the outputs OUTA-OUTN of instances 40A–40N is driven high. Although OR 41 is shown as a single element, in practice a 1000-input OR is impractical, and multiple circuits with a logical culmination of OR would be needed. Embodiments of circuit 40 that output a logical "0" when radiation has been detected is also contemplated. In such case, a logical AND would be used instead of the logical OR 41.

In the example of FIG. 6, the radiation detector is a precharged dynamic circuit. Any circuit known to be susceptible to radiation-caused soft error fails can be used. For example, an SRAM could be used. For a second example, a DRAM could be used.

In a preferred embodiment, on an SOI semiconductor chip, the area of the chip in which radiation detector 31 is placed should be defined with a mask 19. This will cause the FETs comprising radiation detector 31 to not have the insulating layer under them, and therefore, those FETs will not be SOI FETs, but rather, will be bulk FETs and will have a soft error rate associated with bulk CMOS, instead of SOI CMOS. Soft error rate in bulk CMOS is at least an order of magnitude larger for CMOS technologies operating at one volt or less, as described earlier.

Figure 8:
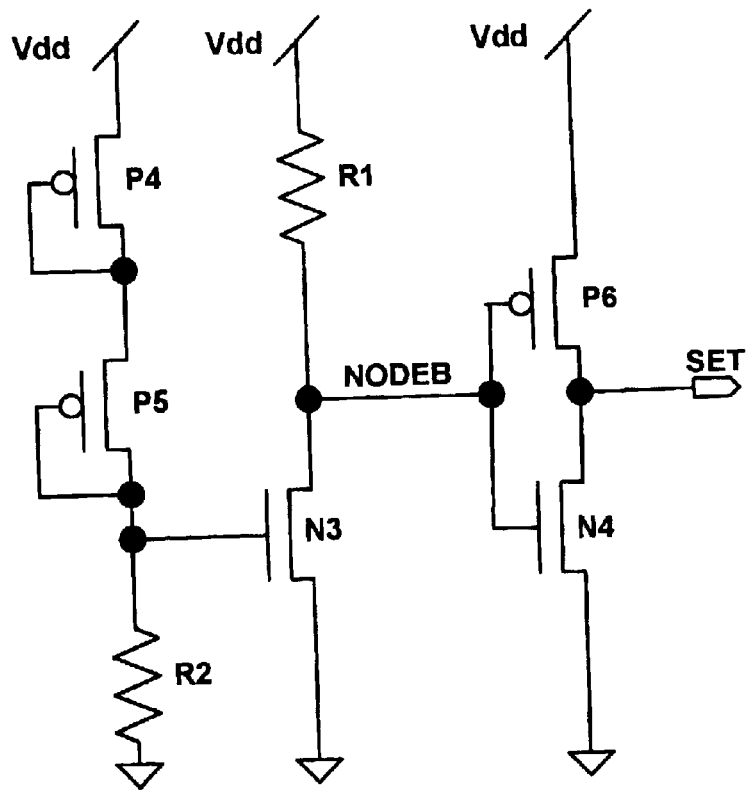
FIG. 8 shows an exemplary circuit that can be used to set the dynamic circuit of FIG. 6 during power-up of the chip.

FIG. 8 shows a circuit that provides a SET signal suitable for use by the circuit of FIG. 6. The circuit in FIG. 8 maintains a logic "0" output during Vdd power-up of the chip until Vdd reaches approximately three threshold voltages above ground. When Vdd becomes high enough to activate PFET P4, PFET P5, and NFET N3, N3 will conduct. Resistors R2 and R1 are high-resistance resistors. R2 ensures that the gate of N3 is at ground potential until P4 and P5 begin to conduct. When N3 begins to conduct current, NODEB falls from a high voltage to a low voltage. An inverter comprising PFET P6 and NFET N4 is coupled to NODEB and responds to NODEB falling by raising SET. A variation on this circuit is to replace N4 by a high resistance resistor (not shown) coupled between SET and ground.

Figure 9:
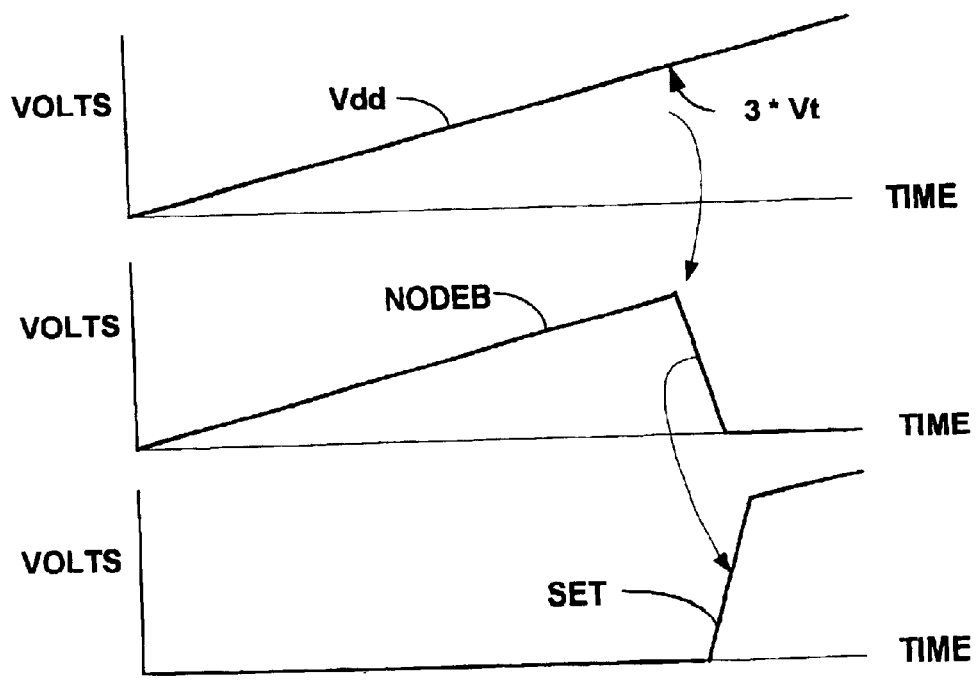
FIG. 9 shows exemplary voltage waveforms of the exemplary circuit of FIG. 8.

FIG. 9 shows the waveforms of the circuit of FIG. 8. In the top graph, Vdd is shown ramping linearly. A linear increase in Vdd with time as shown is exemplary only and is not a requirement. Most Vdd power supplies take microseconds or milliseconds to reach their operating Vdd voltage. In the middle graph, NODEB follows (is the same voltage as) Vdd, since N3 is nonconducting and no current flows through R1. However, when Vdd exceeds the sum of the threshold voltages of P4, P5, and N3, N3 begins to conduct; NODEB then falls to a low level. In the bottom graph, the voltage of SET is shown, remaining at ground until NODEB falls; then, responsive to NODEB falling, SET rises, and quickly becomes the same voltage as Vdd.

Figure 10:
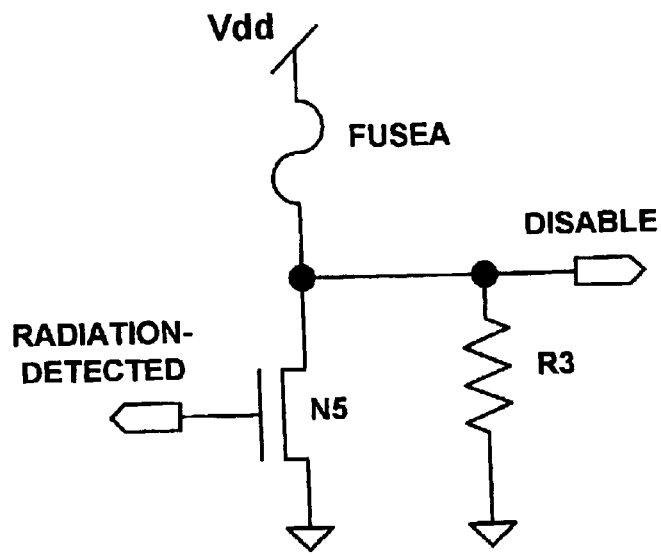
FIG. 10 shows a circuit capable of storing nonvolatile information in the failure memory.

FIG. 10 shows a nonvolatile embodiment of failure memory 32. Node OUT of the circuits of FIG. 6 or FIG. 7 is coupled to the radiation-detected input of FIG. 10. When no radiation has been detected, the radiation-detected input of FIG. 10 is low and NFET N5 is nonconducting. However if the radiation-detected input is driven high by radiation detector 31, N5 conducts. N5 is coupled to FUSEA, and N5 is designed to conduct sufficient current to cause FUSEA to change from a conductor to a nonconductor. Familiarly, this is often called "blowing the fuse". Resistor R3 is a high-resistance resistor. If FUSEA is a conductor, output DISABLE will be essentially at Vdd. If FUSEA is a nonconductor, R3 will pull output DISABLE to ground.

Output DISABLE of FIG. 10 is suitable to drive DISABLE 38, shown in FIG. 5.

FIGS. 11A–11D are examples of possible user functions 33 that can be disabled by DISABLE 38.

Figure 11A:
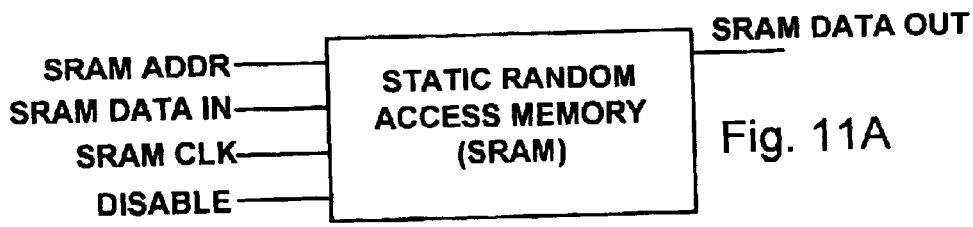
FIGS. 11A–11D show several exemplary user functions that can be disabled, using a value or values stored in the failure memory.

FIG. 11A shows an exemplary SRAM that has a DISABLE input that can be coupled to DISABLE 38. If the signal driving the DISABLE input is active, the SRAM will not operate. Many methods of disabling the SRAM will be apparent to those skilled in the art, including forcing some or all outputs of the SRAM to predetermined voltage levels, degating the SRAM CLK input, or other such means.

Figure 11B:
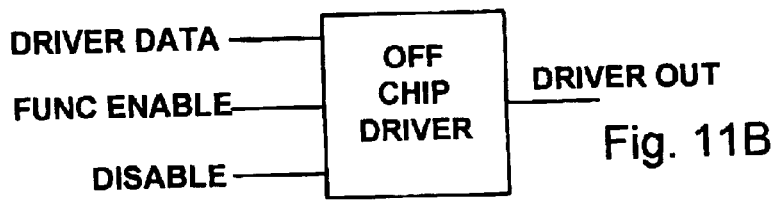

FIG. 11B shows an exemplary Off Chip Driver (OCD). The OCD is shown having a DRIVER DATA input, a FUNC ENABLE input, and a DISABLE input. DRIVER DATA is coupled to a signal the user wants to drive off the chip. FUNC ENABLE is an input often present on an OCD that can be used to force the output of the OCD to a high impedance state, driving neither a logic "1" nor a logic "0". Such high impedance state is often used when multiple OCDs, usually from separate chips, are coupled onto the same signal interconnect. Disabling an OCD with a DISABLE input can include forcing the output, DRIVER OUT, of the OCD to a predetermined voltage, advantageously Vdd or ground, or causing the OCD to be in a high impedance state.

Figure 11C:
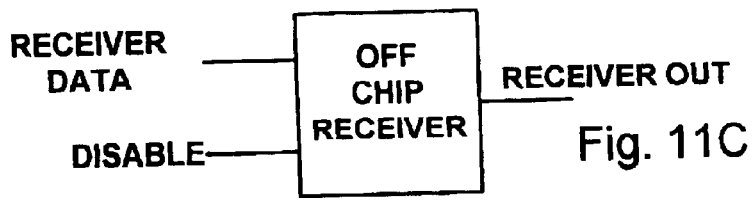

FIG. 1C shows an exemplary Off Chip Receiver (OCR), having a RECEIVER DATA input and a DISABLE input. The OCR normally receives signals driven from other chips and drives those signals onto the current chip. Often, an OCR performs signal shaping, hysteresis function, or level shifting. The OCR in FIG. 11C is designed such that when DISABLE is active, RECEIVER OUT is driven to a predetermined voltage, advantageously Vdd or ground.

Figure 11D:
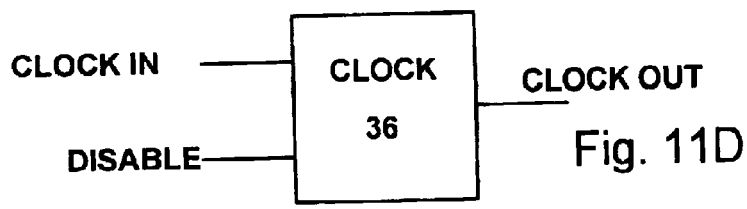

FIG. 11D shows an exemplary CLOCK 36 circuit. CLOCK 36 is shown in FIG. 11D having inputs CLOCK IN and DISABLE. When DISABLE is active, CLOCK OUT is forced to a predetermined voltage, advantageously Vdd or ground.

The user functions 33 of FIGS. 11A–11D are exemplary only. Any user function 33 that can be disabled responsive to detection of radiation is contemplated by this invention.

A preferred embodiment implements all, or substantially all, of the OCDs of the chip as shown in FIG. 11B.

Figure 12:
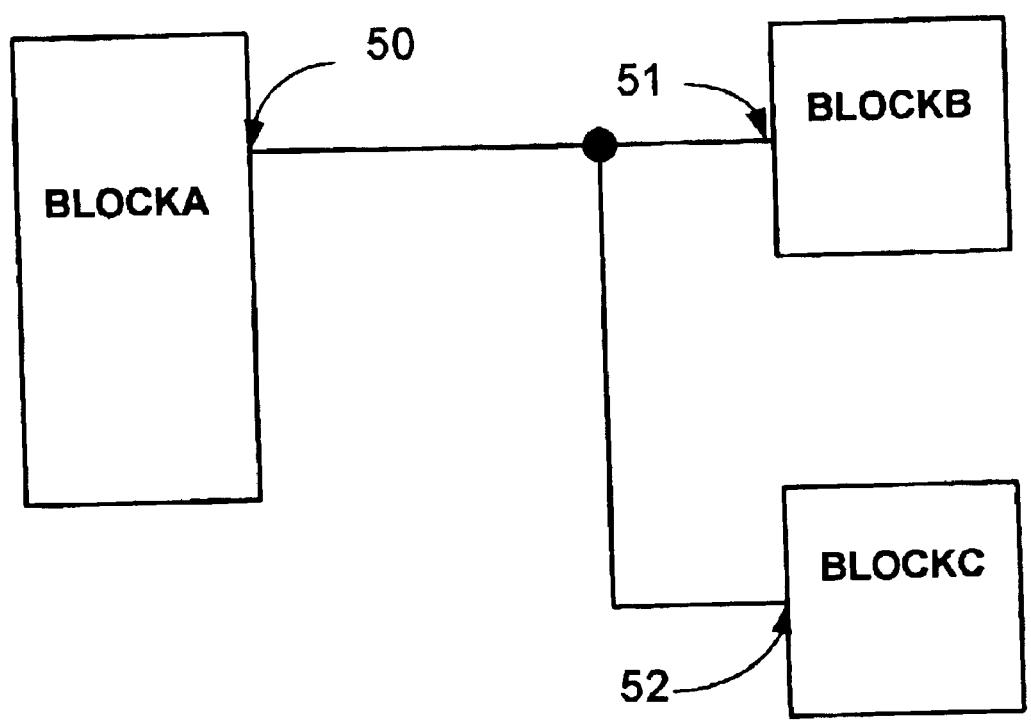
FIG. 12 shows block diagram of a first block coupled to two other blocks, with attention drawn to the physical connections to the blocks.

FIG. 12 shows three logic blocks coupled by on-chip interconnect wiring. BLOCKA is coupled to the interconnection at node 50; BLOCKB is coupled to the interconnection at node 51; BLOCKC is coupled to the interconnection at node 52. Such connection nodes are called ports or pins of the blocks. A common feature of design systems used to manage, assemble, and check the use and interconnection, of logic blocks on chips is the ability to assign pintypes to pins of blocks, and to use this pintype information to check that blocks are properly connected.

For example, in an embodiment, BLOCKA is failure memory 32, and pin 50 is the driving pin of a DISABLE 38 signal. BLOCKB in the example is an OCD, and pin 51 is the DISABLE input of the OCD. BLOCKC is a CLOCK and pin 51 is the DISABLE input of CLOCK 36. A technologist codes pintypes associated with pin 51 and pin 52 to require that they be connected to a pin 50 (i.e., a DISABLE 38 signal source). The design system, when doing its checking to verify that signals on the chip are properly connected, will ensure that if a pin 51 or a pin 52 is found on an interconnection, that a pin 50 is also found on the interconnection. Checking rules can also ensure that a radiation detector 31, a failure memory 32, and a user function 33 that can be disabled are selected by a designer for inclusion in the design.

Figure 13:
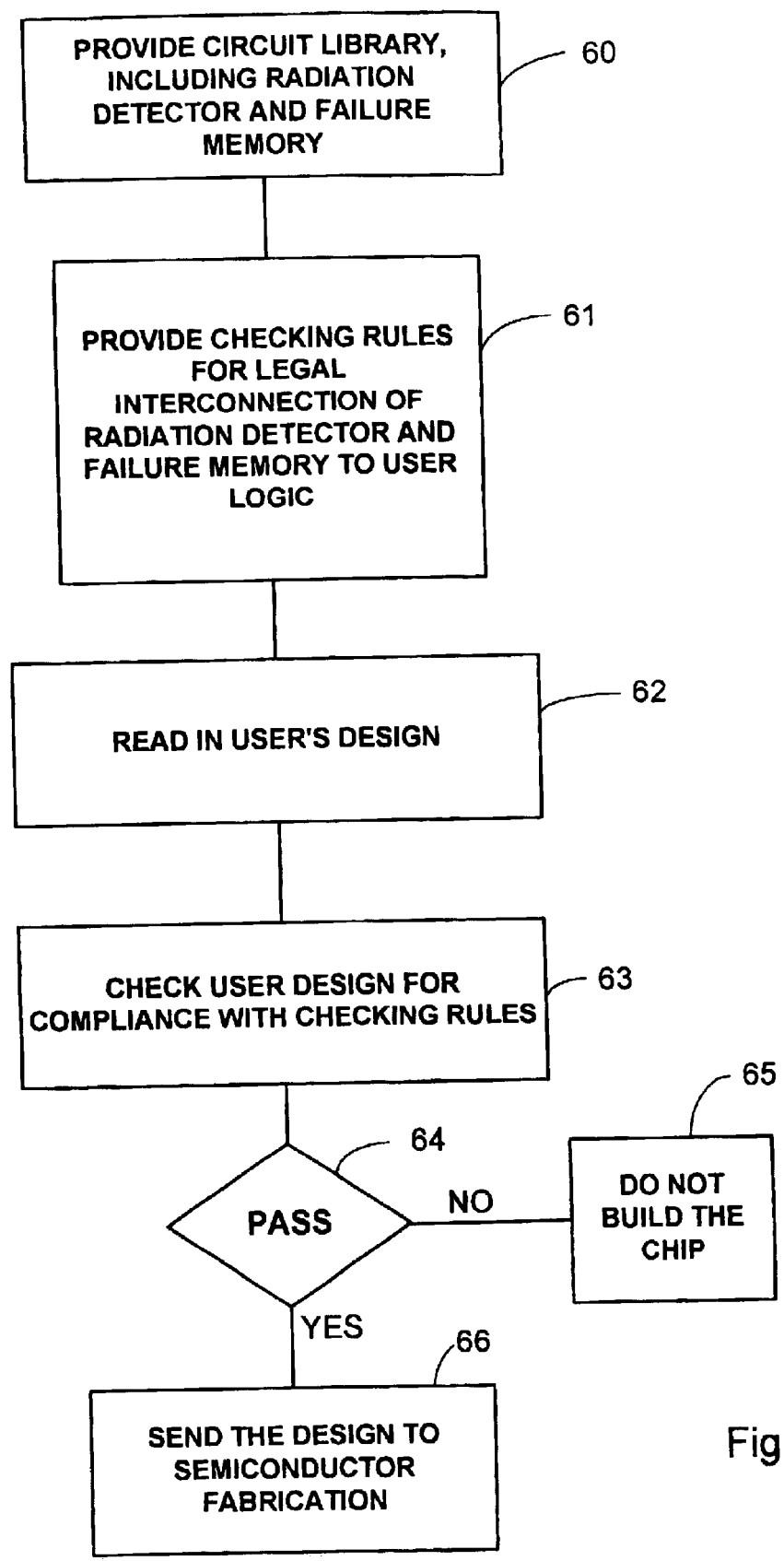
FIG. 13 shows a flow diagram of an exemplary process embodying the invention.

FIG. 13 shows an exemplary flowchart that shows a set of steps that can be used to implement the invention.

In step 60, the technologist provides a circuit library that a user can choose logic functions from to implement his or her design. The user interfaces with a design system in choosing logic functions and interconnecting the logic functions. Such logic functions can include, but are not limited to, NANDs, NORs, Exclusive Ors, And-Or-Inverters, latches, registers, SRAMs, DRAMs, Arithmetic Logic Units (ALUs), OCD's, OCR's, Clocks, and PLAs. Some or all of these functions are designed with a DISABLE input. When the DISABLE input is driven to an active state, the logic function is disabled. The technologist includes in the library one or more radiation detectors and one or more failure memories.

In step 61, the technologist creates checking rules and checking information that the design system utilizes to ensure correctness in the use and interconnection of the logic functions. Among those rules are pintype rules, described earlier, which are used by the design system to ensure that particular pins of each logic block are coupled to pins required by the pintype rule for those particular pins. In particular, DISABLE input pins must have pintypes that require coupling to a suitable pin driving a DISABLE signal, as described earlier. Furthermore, the checking rules verify that at least one radiation detector 31 and at least one failure memory 32 have been selected for inclusion in the design. (Note that in some embodiments, as described earlier, radiation detector 31 and failure memory 32 may be merged).

In step 62, the user's design is read in by the design system.

In step 63, the design system checks the user's design for completeness and correctness, according to the checking rules. Typically, a great deal of checking is done, for examples, verifying timing correctness, checking for pins that have been left unconnected, checking test methodology correctness, and the like. In accordance with the current invention, pintype checking is done to ensure compliance with the pintype rules. If, for example, a pintype on a DISABLE input requires coupling to a pin of a block that drives a DISABLE signal 38, but the coupling to a pin of a block that drives a DISABLE signal 38 is not found on the interconnection, that check will result in an error.

In step 64, the results of the design system's checking for completeness and correctness is examined. If one or more errors have been discovered, the chip will not be built, as shown in step 65. Normally, in such a case, the user is notified and informed of the error(s) in his design. The user can then choose to correct the error(s) or abandon the effort. If no errors were discovered by the design system the design is sent to the semiconductor fabrication facility, where the chip will be built.

The above process ensures that the chip, as sent to the user, will not be radiation hard enough to be categorized as munitions. The technologist can more widely and freely market the chip.

While the present invention has been described with reference to the details of the embodiments of the invention shown in the drawings, these details are not intended to limit the scope of the invention as claimed in the appended claims.

What is claimed is:

1. A semiconductor chip comprising:
   a first area that has been processed to include an insulating layer under a silicon layer, and a plurality of Field Effect Transistors (FETs) being formed in the silicon layer;
   a second area that has been processed such that the insulating layer is absent in the second area;
   a radiation detector capable of sensing radiation, and producing one or more radiation detected signals upon detection of radiation, at least a portion of the radiation detector being within the second area;
   a failure memory, having one or more failure memory outputs, that retains information transmitted by the radiation detected signals;
   a user function that is disabled respondent to the failure memory outputs.

2. The semiconductor chip of claim 1, wherein the failure memory is a volatile memory.

3. The semiconductor chip of claim 1, wherein the failure memory is a nonvolatile memory.

4. The semiconductor chip of claim 3, wherein the failure memory comprises a fuse.

5. The semiconductor chip of claim 3, wherein the failure memory comprises a ferroelectric memory device.

6. The semiconductor chip of claim 3, wherein the failure memory comprises a flash memory device.

7. The semiconductor chip of claim 1, wherein the user function which is disabled respondent to the failure memory outputs comprises an off chip driver.

8. The semiconductor chip of claim 1, wherein the user function which is disabled respondent to the failure memory outputs comprises an off chip receiver.

9. The semiconductor chip of claim 1, wherein the user function that is disabled respondent to the failure memory outputs comprises a clock.

10. The semiconductor chip of claim 1, wherein the user function that is disabled respondent to the failure memory outputs comprises a static random access memory.

11. The semiconductor chip of claim 1, wherein the radiation detector comprises a dynamic precharged circuit, the dynamic precharged circuit being within the second area.

12. The semiconductor chip of claim 1, wherein the radiation detector comprises a static random access memory, the static random access memory being within the second area.

13. The semiconductor chip of claim 1, wherein the radiation detector comprises a dynamic random access memory, the dynamic random access memory being within the second area.

14. A method for implementing a semiconductor chip design, comprising the steps of:
   providing a circuit library comprising logic functions from which a designer can select from the logic functions, the functions including a radiation detector, and a failure memory with an output, and at least one user function that can be disabled respondent to the output from the failure memory;
   providing a plurality of checking rules capable of ensuring that the radiation detector, the failure memory, and the at least one user function that can be disabled are present on any design created from the circuit library and are properly interconnected;
   reading in a user design, which specifies selections from the circuit library and interconnection of the selections;
   checking the user design for compliance with the checking rules; and
   ensuring that the user design is not fabricated into a semiconductor chip if the user design is not in compliance with the checking rules.

15. The method of claim 14, wherein the step of providing a plurality of checking rules comprises the steps of:
   providing a first checking rule capable of checking that at least one instance of a radiation detector is selected in any design created from the circuit library;
   providing a second checking rule capable of checking that at least one instance of a failure memory is selected in any design created from the circuit library;
   providing a third checking rule capable of checking that at least one user function that can be disabled respondent to the output from the failure memory is selected in any design created from the circuit library;
      providing a fourth checking rule capable of checking that the at least one user function that can be disabled respondent to the output from the failure memory is coupled to the output of the failure memory; and
      providing a fifth checking rule capable of checking that the failure memory is coupled to the radiation detector.

16. The method for implementing a semiconductor chip design of claim 14, wherein the step of providing the circuit library includes, for the radiation detector, further comprises the step of:
   designing at least some of the circuitry in the radiation detector to have a high soft error rate, relative to circuitry in the logic functions of the circuit library which are not radiation detectors.

17. method for implementing a semiconductor chip design of claim 16, wherein the step of designing at least some of the circuitry in the radiation detector to have a high soft error rate, relative to circuitry in the logic functions of the circuit library which are not radiation detectors comprises the steps of:
   designing at least some of the circuitry in the radiation detector to be bulk CMOS circuitry; and
   requiring the at least of some of the circuitry in the radiation detector designed as bulk CMOS circuitry to be placed in an area of a silicon on insulator (SOI) chip which does not have an insulating layer under a top layer of silicon, a plurality of Field Effect Transistors on the chip being fabricated within the top layer of silicon.

* * * * *